United States Patent
Willis et al.

(10) Patent No.: US 11,023,247 B2
(45) Date of Patent: Jun. 1, 2021

(54) PROCESSOR PACKAGE WITH OPTIMIZATION BASED ON PACKAGE CONNECTION TYPE

(71) Applicant: Intel Corporation, Santa Clara, CA (US)

(72) Inventors: Daniel Willis, Portland, OR (US); Jonathan Thibado, Beaverton, OR (US); Eugene Nelson, Olympia, WA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/024,151

(22) Filed: Jun. 29, 2018

(65) Prior Publication Data

US 2019/0042270 A1 Feb. 7, 2019

(51) Int. Cl.
*G06F 9/38* (2018.01)
*G06F 9/30* (2018.01)
*H01L 23/31* (2006.01)

(52) U.S. Cl.
CPC .......... *G06F 9/3885* (2013.01); *G06F 9/3004* (2013.01); *G06F 9/30098* (2013.01); *G06F 9/30181* (2013.01); *H01L 23/3121* (2013.01)

(58) Field of Classification Search
CPC ...... G06F 1/3203; G06F 1/3209; G06F 1/324; G06F 3/0625; G06F 3/0634; G06F 1/3287; G06F 1/3215; G06F 1/206
USPC ............ 713/300, 320, 323, 322, 1, 100, 324
See application file for complete search history.

(56) References Cited

U.S. PATENT DOCUMENTS

| | | | | |
|---|---|---|---|---|
| 5,884,049 A * | 3/1999 | Atkinson | ............... | G06F 1/1632 361/679.41 |
| 6,006,327 A * | 12/1999 | Chang | ................. | G06F 15/7864 713/1 |
| 6,029,215 A * | 2/2000 | Watts, Jr. | ............... | G06F 1/1632 361/679.32 |
| 6,426,872 B1 * | 7/2002 | Sutton | ................. | B60R 11/0252 361/679.41 |
| 6,461,181 B1 * | 10/2002 | Goh | ...................... | H01R 12/721 439/289 |
| 6,701,515 B1 * | 3/2004 | Wilson | ................ | G06F 17/5045 716/102 |
| 10,504,848 B1 * | 12/2019 | Parto | ..................... | H01L 23/645 |
| 2006/0136764 A1 * | 6/2006 | Munguia | ............... | G06F 1/3203 713/322 |
| 2006/0229502 A1 * | 10/2006 | Pollock | .............. | A61B 5/14532 600/300 |
| 2008/0010533 A1 * | 1/2008 | Hirano | .................... | G06F 11/26 714/37 |

(Continued)

*Primary Examiner* — Faisal M Zaman
(74) *Attorney, Agent, or Firm* — Hanley, Flight & Zimmerman, LLC

(57) ABSTRACT

The systems and methods disclosed herein provide an improved processor package to determine a connection type between the package and an external circuit and to optimize processor performance based on the connection type. As a non-limiting example, a processor package consistent with the present disclosure may include a central processing unit (CPU) die and a plurality of pins (including two connection detection pins) to connect the package to a motherboard. The CPU die may include connection determination logic and execution policy logic, implemented via processor code ("p-code"), as well as a more typical processor.

29 Claims, 9 Drawing Sheets

(56) References Cited

U.S. PATENT DOCUMENTS

| | | | |
|---|---|---|---|
| 2010/0011198 A1* | 1/2010 | Hooker | G06F 1/3203 |
| | | | 713/1 |
| 2012/0124339 A1* | 5/2012 | Krishnapura | G06F 9/5033 |
| | | | 712/216 |
| 2013/0024715 A1* | 1/2013 | Hung | G06F 1/206 |
| | | | 713/501 |
| 2013/0311804 A1* | 11/2013 | Garg | G06F 1/3203 |
| | | | 713/320 |
| 2014/0089603 A1* | 3/2014 | Krishnapura | G06F 1/3275 |
| | | | 711/146 |
| 2015/0358810 A1* | 12/2015 | Chao | H04W 52/0209 |
| | | | 455/418 |
| 2017/0075648 A1* | 3/2017 | Sun | H04L 12/2816 |
| 2017/0179069 A1* | 6/2017 | Carstens | B23K 1/0016 |
| 2017/0207170 A1* | 7/2017 | Nair | H01L 21/563 |
| 2017/0354031 A1* | 12/2017 | Aoki | H05K 3/3494 |
| 2018/0181183 A1* | 6/2018 | Yoon | G06F 1/324 |
| 2018/0206277 A1* | 7/2018 | Krenz | H04W 24/02 |

\* cited by examiner

PROCESSOR PACKAGE WITH OPTIMIZATION BASED ON PACKAGE CONNECTION TYPE

TECHNICAL FIELD

The present disclosure relates to systems and methods for optimizing CPU performance based on a connection type between the CPU and a motherboard.

BACKGROUND

In modern computing systems, central processing units (CPUs) are typically connected to a motherboard. There are several different approaches to securing this connection, including Ball Grid Array (BGA) and Land Grid Array (LGA). Due to well-known general electronic concepts, the nature of this connection results in varying performance penalties (e.g., parasitic resistance, inductance and capacitance, which often negatively impacts signal integrity of high speed input/output (IO) operations as well as the integrity of the power delivery network into the CPU). These penalties generally constrain a CPU's performance, as pushing a CPU's operating settings too far can result in performance limitations (e.g. thermal throttling), system failures (e.g. failing to meet a required bus timing specification), and even damage to the system (often through overheating, though other failures are possible).

As technology advances, new connection setups are developed and existing ones are improved. These improvements often reduce the connection penalties. Reduced connection penalties enable a CPU to operate more aggressively within safe limits, increasing performance. However, as some CPUs are compatible with multiple different connection technologies, they are generally set to operate as if connected using the least efficient supported mechanism. Thus, when such a CPU is actually using a more efficient connection type, it will likely be operating sub-optimally.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Although the following Detailed Description will proceed with reference being made to illustrative embodiments, many alternatives, modifications and variations thereof will be apparent to those skilled in the art.

DETAILED DESCRIPTION

The systems and methods disclosed herein provide an improved processor package to determine a connection type between the package and an external circuit and to optimize processor performance based on the connection type. As a non-limiting example, a processor package consistent with the present disclosure may include a central processing unit (CPU) die and a plurality of pins (including two connection detection pins) to connect the package to a motherboard. The CPU die may include connection determination logic and execution policy logic, implemented via processor code ("p-code"), as well as a more typical processor.

When the package is connected to a motherboard, the state of the connection determination pins may depend upon the type of connection. For example, if the package is connected to the motherboard using a first connection type (e.g., LGA 1151), the connection determination pins may be connected to unpowered slots on the motherboard, or not connected to anything at all. If the package is connected to the motherboard using a second connection type (e.g., Reflow Grid Array (RGA)), the connection determination pins may be connected to powered contact points on the motherboard. The connection determination logic of the CPU die may determine the states of the connection detection pins (e.g., powered vs. unpowered), and based on the states, may further determine the nature of the package's connection to the motherboard (e.g., a standard socket (SKT) vs. RGA).

Depending upon the type of connection, the execution policy logic may select a best execution policy to govern various CPU settings (e.g., clock rate, voltage levels, power-based throttling, etc.). For example, if the connection determination logic determines that the package is connected to the motherboard via more power-and-heat-efficient means like RGA, the execution policy logic may select an execution policy resulting in a higher clock rate, automatically enabling the CPU to operate with improved performance. If the connection determination logic determines that the package is connected to the motherboard via less efficient means like LGA in a SKT, the execution policy logic may select an execution policy resulting in a lower clock rate, protecting the CPU from possible damage resulting from operating at too high of a clock rate under the given thermal conditions.

Throughout this disclosure, reference may be made to connection "types," "styles," "configurations" or "mechanisms." These terms are used interchangeably herein with no intent to limit meaning or scope. Reference throughout this specification is made to various "registers." Though often referred to as singular registers, any register described herein may comprise a plurality of registers.

Figure 1:
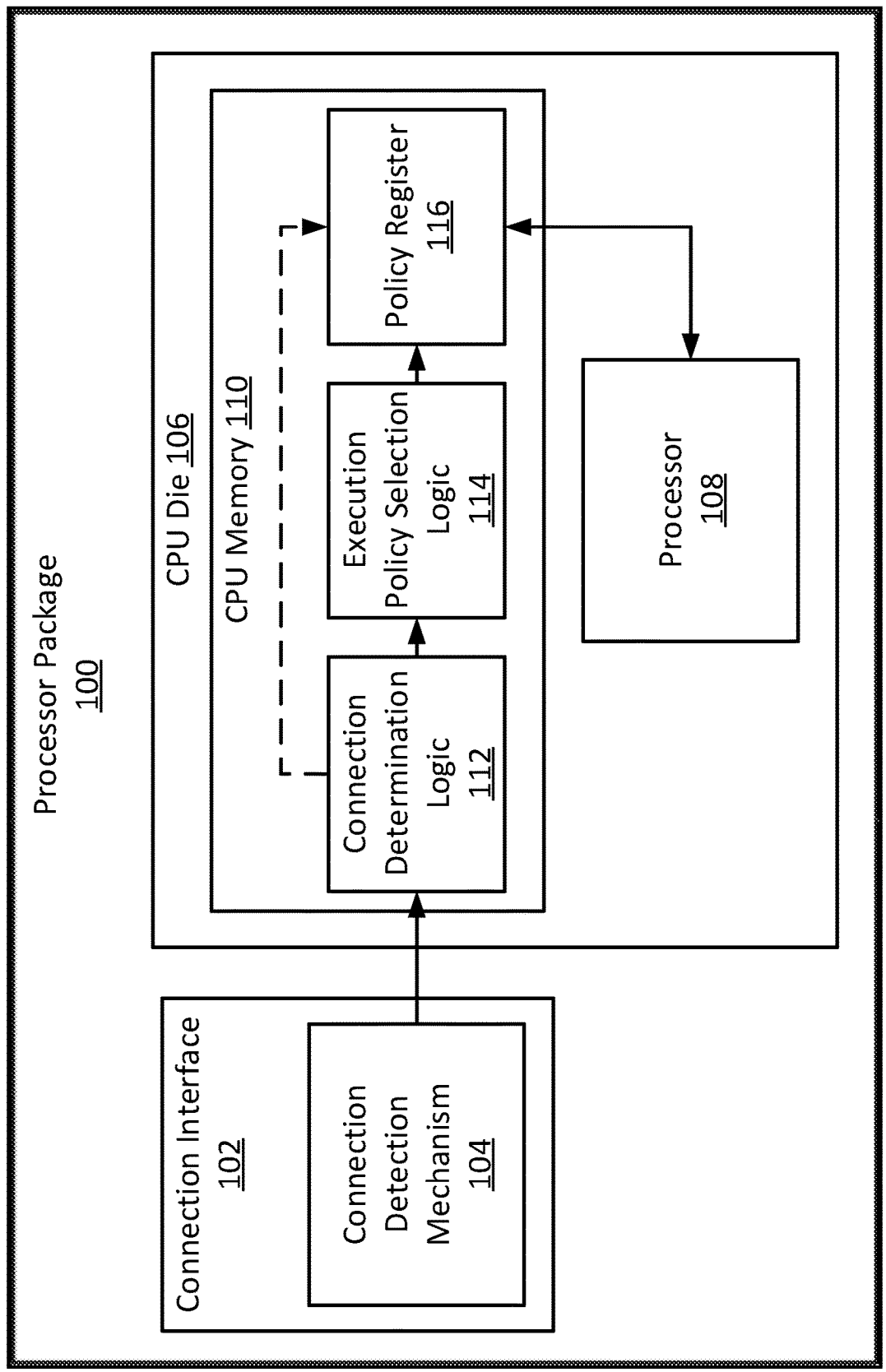
FIG. 1 illustrates an improved processor package consistent with several embodiments of the present disclosure.

FIG. 1 illustrates an improved processor package 100 consistent with several embodiments of the present disclosure. The package 100 generally includes a connection interface 102 and at least one central processing unit (CPU) die 106. Package 100 may also include additional CPU dice not shown in FIG. 1. Connection interface 102 includes connection detection mechanism 104 configured to change between at least two states based on a type of connection between package 100 and an external circuit (not shown in FIG. 1, e.g., a motherboard or other printed circuit board (PCB)). CPU die 106 includes CPU memory 110 and processor 108. CPU memory 110 generally includes various processor code (p-code) and registers to govern operation of the processor. CPU memory 110 further includes connection determination logic 112 and execution policy selection logic 114, described in further detail below.

Processor package 100 is generally configured to connect, secure, or otherwise operably couple to an external circuit. This connection may be accomplished in any of a variety of ways, including using a ball grid array (BGA) connection, land grid array (LGA) connection, reflow grid array (RGA) connection, etc. Common examples in the art include LGA 1151, utilized by processors with the Intel Skylake, Kaby Lake and Coffee Lake architectures; a motherboard with an LGA 1151 connection socket has 1151 pins to make contact with (and thus electronically couple to) corresponding pads on the processor package.

Connection detection mechanism 104 is generally configured to be in one of at least two states depending upon the type of connection between package 100 and the external circuit. This may be accomplished in several ways. In some embodiments, connection detection mechanism 104 may comprise one or more conductive surfaces on package 100. The conductive surfaces may be configured such that when processor package 100 is connected to an external circuit (e.g., motherboard), the conductive surfaces of connection detection mechanism 104 may or may not make contact with connection components (e.g., pins, solder balls, etc.) of the external circuit depending upon the type of connection between package 100 and the external circuit. As a non-limiting example, the conductive surfaces may be configured such that they do not make physical or electrical contact with any pins of an LGA 1151 socket even if package 100 is properly inserted in an LGA 1151 socket; in the same example, the conductive surfaces are electrically coupled to the external circuit if package 100 is connected to the external circuit via RGA. In these and other examples, a powered state of connection detection mechanism 104 depends upon the type of connection between package 100 and an external circuit. For example, conductive surfaces of connection detection mechanism 104 may be powered when package 100 is connected to an external circuit via RGA but unpowered when package 100 is connected to an external circuit via LGA in a SKT.

In some embodiments, connection detection mechanism 104 may only comprise a single conductive surface, and thus may only be able to make contact with a single pin. In embodiments wherein mechanism 104 only comprises a single conductive surface, processor package 100 may only be able to distinguish between two connection types (e.g., when the surface is powered vs. unpowered). Additional conductive surfaces may be added to enable distinction between additional connection types (e.g., SKT vs. varying subtypes of RGA). However, in some embodiments, additional states may be monitored or detected, including grounded vs. floating, differences in current flow, etc.; these additional states may enable distinction between additional connection types even with comparatively fewer conductive surfaces.

In some embodiments, conductive surfaces of connection detection mechanism 104 may be configured to electronically couple with features of an external circuit other than pins. For example, connection detection mechanism 104 may include conductive surfaces on a back side of processor package 100, configured to be connected to, e.g., locking features of an external circuit, one or more plugs, etc.

Connection determination logic 112 may be implemented on CPU memory 110 of CPU die 106, though in some embodiments logic 112 may be implemented via an external circuit/basic input/output system (BIOS) instead. Connection determination logic 112 is generally configured to receive one or more signals from connection detection mechanism 104 and to determine, based on those signals, a connection type between processor package 100 and an external circuit. Connection determination logic 112 is further generally configured to provide an indication of the connection type. For example, connection determination logic 112 may store or otherwise write a value corresponding to the connection type to at least one register (e.g., a model-specific register (MSR) on Intel x86 processors) to enable other components of package 100 to determine the connection type.

Execution policy selection logic 114 may be implemented on CPU memory 110 of CPU die 106. As with logic 112, in some embodiments, logic 114 may be implemented on an external circuit via BIOS. Execution policy selection logic 114 is generally configured to select or otherwise determine a policy comprising one or more settings to govern operation of processor 108. For example, the policy may control settings such as clock rate, voltage, throttling settings/thresholds, etc. Execution policy selection logic 114 may be configured to select a "best" policy for processor package 100 based on a connection type as indicated by connection detection mechanism 104 and determined by connection determination logic 112. In some embodiments, logic 114 may be configured to query a policy database having predetermined policies (e.g., loaded into CPU memory 110 by a manufacturer of processor package 100), each policy corresponding with at least one connection type. Logic 114 may then select an appropriate policy from the database based on the connection type.

In some embodiments, execution policy selection logic 114 may be configured to determine (e.g., automatically generate) a best policy. As a non-limiting example, connection detection mechanism 104 and connection determination logic 112 may be configured to generate some performance information such as overall path resistance, timing information, or temperature data. Based on this information, logic 114 may determine settings (such as clock rate and voltage levels) that will result in improved performance without significant risk of failure.

In some embodiments, this "best" policy may refer to a policy resulting in maximum performance while remaining within safe limitations (e.g., temperature, power consumption, etc.). In some embodiments, the "best" policy may correspond to a policy resulting in increased processor stability, and thus increased platform stability. For example, even though a connection type may be more power efficient resulting in reduced temperatures, in some embodiments the policy will regardless cause the processor to operate at normal clock rates (e.g., manufacturer-recommended speeds, often in the 3.0 GHz-4.0 GHz range). Even though the processor 108 may be able to operate at higher clock rates while remaining within safe temperatures, operating at even lower temperatures may beneficially provide additional stability to the processor package 100 and any platform package 100 is installed in.

Execution policy selection logic 114 is further configured to indicate the determined best policy. For example, execution policy selection logic 114 may write or otherwise store one or more values corresponding to the determined policy in one or more registers. As the meaning of "best" may vary between various embodiments or systems, execution policy selection logic 114 may write or otherwise indicate more than one determined policy (e.g., write that a first policy is a "best performance" policy to a first register and write that a second policy is a "best stability" policy to a second register). This may allow quick selection or switching between policies, which can be advantageous for many reasons; for example, a user may prefer different policies at different times, systems may dynamically change policies depending upon many factors (e.g., a computer system operating temporarily operating as a server may opt for increased stability, but otherwise default to a high-performance policy), etc.

Policy register 116 may comprise one or more registers on processor package 100. While this disclosure will generally refer to policy register 116 as a single register, this is intended only as a non-limiting example. In some embodiments, policy register 116 may comprise multiple registers. Policy register 116 may be, for example, an MSR. Both connection determination logic 112 and execution policy selection logic 114 are capable of writing to policy register 116, wherein connection determination logic 112 is typically to write values representing or corresponding to a connection type between processor package 100 and an external circuit, and execution policy selection logic 114 is generally to write values representing a determined best execution policy. These operations may occur at any time during operation of a computing system, including at system startup or initial boot. In some embodiments, policy register 116 may store a tag or other identifier corresponding to a policy to conserve available storage capacity, wherein the policy itself is stored elsewhere (one or more different registers, system memory, nonvolatile storage, etc.). In some embodiments, the entire policy is stored in register 116.

Processor 108 comprises various integrated circuit components (e.g., transistors, etc.) configured to execute computer-readable instructions generally configured to operate under the policy specified by execution policy selection logic 114. Processor 108 accesses policy register 116 used to store a policy or a value corresponding to a policy. As described above, this policy governs various settings of processor 108 including, for example, clock rate, voltage levels, thermal settings (e.g. power limit 1 or 2 (PL1, PL2)), input/output (IO) buffer/driver strength, turbo dwell times, etc.

Figure 2:
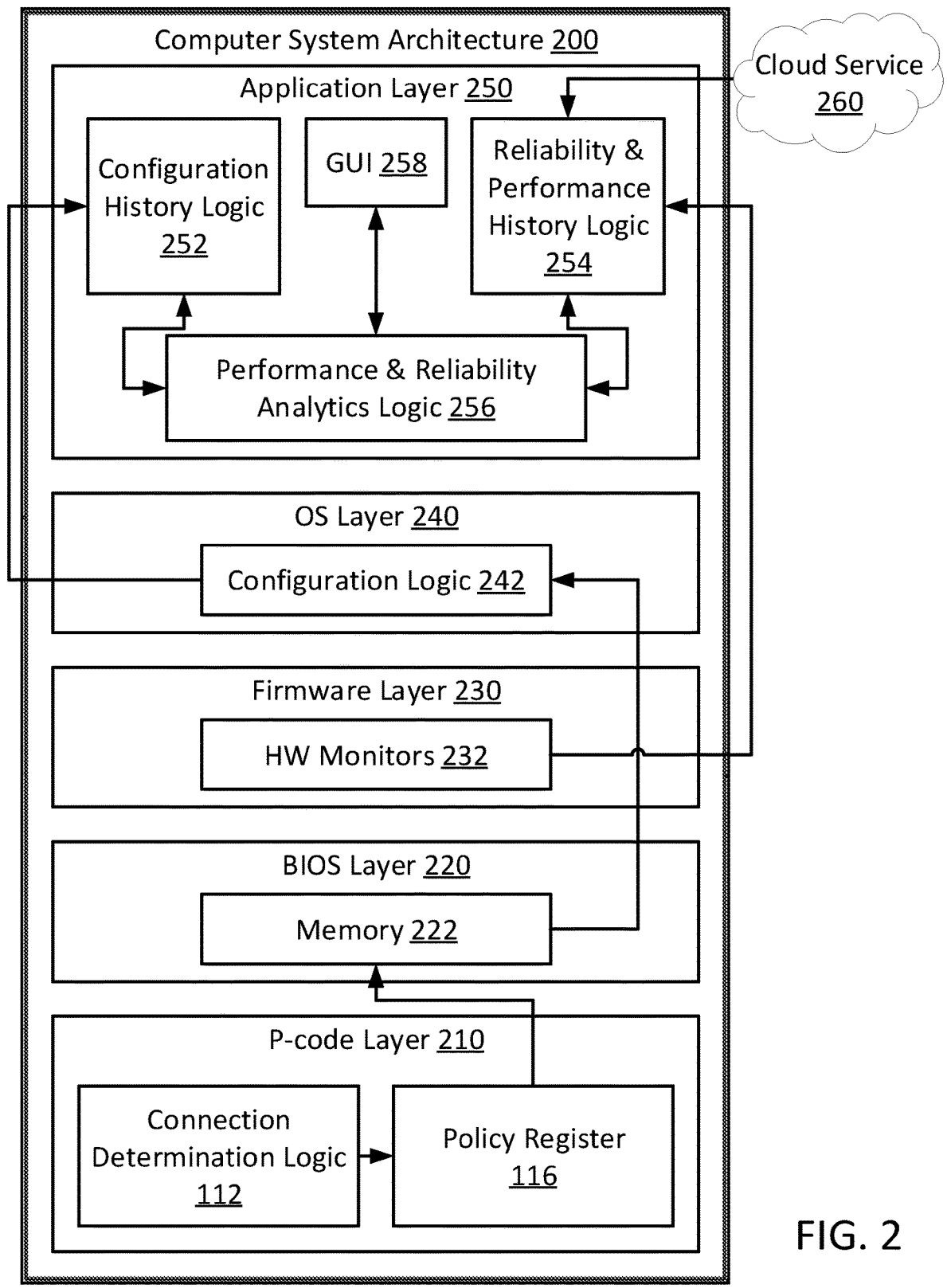
FIG. 2 illustrates an example computer system architecture consistent with one embodiment of the present disclosure.

FIG. 2 illustrates an example computer system architecture 200 consistent with one embodiment of the present disclosure. Computer system 200 generally comprises several layers of abstraction (referred to herein simply as "layers"), including processor code (p-code) layer 210, basic input/output system (BIOS) layer 220, firmware layer 230, operating system (OS) layer 240 and application layer 250. Each of these layers comprises various subsystems or components. p-code layer 210 may include connection determination logic 112 and policy register 116. While policy register 116 may not itself be implemented via p-code, the values within are generally set as a result of processor 108 executing p-code instructions (e.g., during initial boot). Thus, policy register 116 is depicted within p-code layer 210 in FIG. 2. The values within policy register 116 are then reported to BIOS in BIOS layer 220.

In BIOS layer 220, values from policy register 116 are reported and stored on memory 222. Memory 222 may comprise, for example, BIOS memory, system memory, etc. Memory 222 may be volatile memory (in that it may require power to retain stored information) or nonvolatile memory, however in some embodiments while memory 222 may be volatile memory, it may be configured to receive continuous power from system power, standby power, and/or an onboard battery when system and standby power are unavailable, making memory 222 functionally nonvolatile. In some embodiments, memory 222 may comprise volatile complementary metal-oxide-semiconductor (CMOS) static random access memory (SRAM). The reported values in memory 222 are monitored by configuration logic 242 of OS layer 240, as described in further detail below.

Firmware layer 230 generally includes various firmware modules and logic to support interaction between higher-level software (such as applications executing on computer system architecture 200) and hardware (such as processor package 100). For example, firmware layer 230 includes various hardware (HW) monitors 232. HW monitors 232 are generally configured to monitor performance and reliability of CPU and related platform components and subcomponents. For example, HW monitors 232 may monitor temperature, current, voltage, etc. across multiple locations and/or hardware components (e.g., memory, power supply unit (PSU), hard drives, processor package 100) in a computer system. Firmware layer 230 may also include hardware drivers (not shown in FIG. 2) to enable functionality of various system hardware.

In some embodiments, an OS (e.g., Microsoft Windows, Apple OSX, iOS, Android, one of various Linux distributions, etc., not shown in FIG. 2) executing within OS layer 240 of computer system architecture 200 includes configuration logic 242 to monitor the values reported to memory 222 from policy register 116. This enables the OS to monitor changes to the configuration of system architecture 200. For example, configuration logic 242 may monitor (and thus enable the OS to monitor) a type of connection used to connect processor package 100 to the motherboard, monitor a current execution policy, determine a "best" execution policy (as identified by execution policy selection logic 114), etc.

In some embodiments, computer system architecture 200 may be configured to provide details regarding various system performance statistics, connection type and execution policies to one or more applications executing within application layer 250. This in turn may enable a user of computer system architecture 200 to view these details by means of a graphical user interface (GUI). Further, in some embodiments, applications executing within application layer 250 may enable a user to make changes, as will be described in further detail below. For example, an application executing in application layer 250 may include configuration history logic 252, performance analytics logic 254, reliability and performance history logic 256 and GUI 258.

Configuration history logic 252 is generally configured to communicate or otherwise interact with configuration logic 242 of OS layer 240 and receive information regarding HW and software (SW) configuration. Configuration history logic 252 may further be configured to track changes to HW and SW configuration. Tracked changes may include, for example, clock rate, voltage levels, thermal settings (e.g. PL1, PL2), connection type, execution policy, performance statistics (e.g., throughput) of various SW applications executing on computer system architecture 200, etc. Configuration history logic 252 may track configuration changes over time and store information corresponding to the tracked changes in nonvolatile memory (e.g., one or more hard drives, flash drives, etc.).

Performance history logic 254 is generally configured to receive updates from HW monitors 232 of firmware layer 230 to track performance of components over time. For example, performance history logic 254 may track statistics regarding power consumption, idle time, system memory usage, etc. Logic 254 may further record these statistics in a database, for example in nonvolatile memory, memory 222, etc. Logic 254 may further interact with an external cloud service 260.

Cloud service 260 may enable logic 254 to exchange information on performance history. As a non-limiting example, logic 254 may be configured to communicate with cloud service 260 (via, for example, a connection interface enabling access to the internet) to receive information including optimization suggestions. For example, logic 254 may send system description information (e.g., connection type, performance history, execution policy, etc.) to cloud service 260 and receive optimization suggestions based on the description information (e.g., optimizations that were beneficial to similar systems). Logic 254 may include these optimization suggestions in communications with performance analysis logic 256.

Performance analytics logic 256 is generally configured to receive inputs from configuration history logic 252 and performance history logic 254. Logic 256 may further determine system performance correlations based on correlating changes in configuration to changes in performance or reliability. For example, if setting processor 108 into a high-performance execution policy occurs prior to an unacceptable increase in temperature (e.g., a rise in CPU temperature above a predetermined acceptable boundary, such as 100° C.) or other failure, logic 256 may correlate these changes to determine that the selected high-performance execution policy was responsible for the failure. In some embodiments, logic 256 may then automatically switch processor 108 to a different execution policy (possibly querying policy register 116 for a predetermined alternative). Performance analytics logic 256 may also be configured to submit information regarding configuration changes and correlated performance/reliability impacts to GUI 258 to be presented to a user. Similarly, logic 256 may receive commands from a user via GUI 258 (e.g., to enable a user to manually change a policy, or query for more specific information, etc.).

Figure 3:
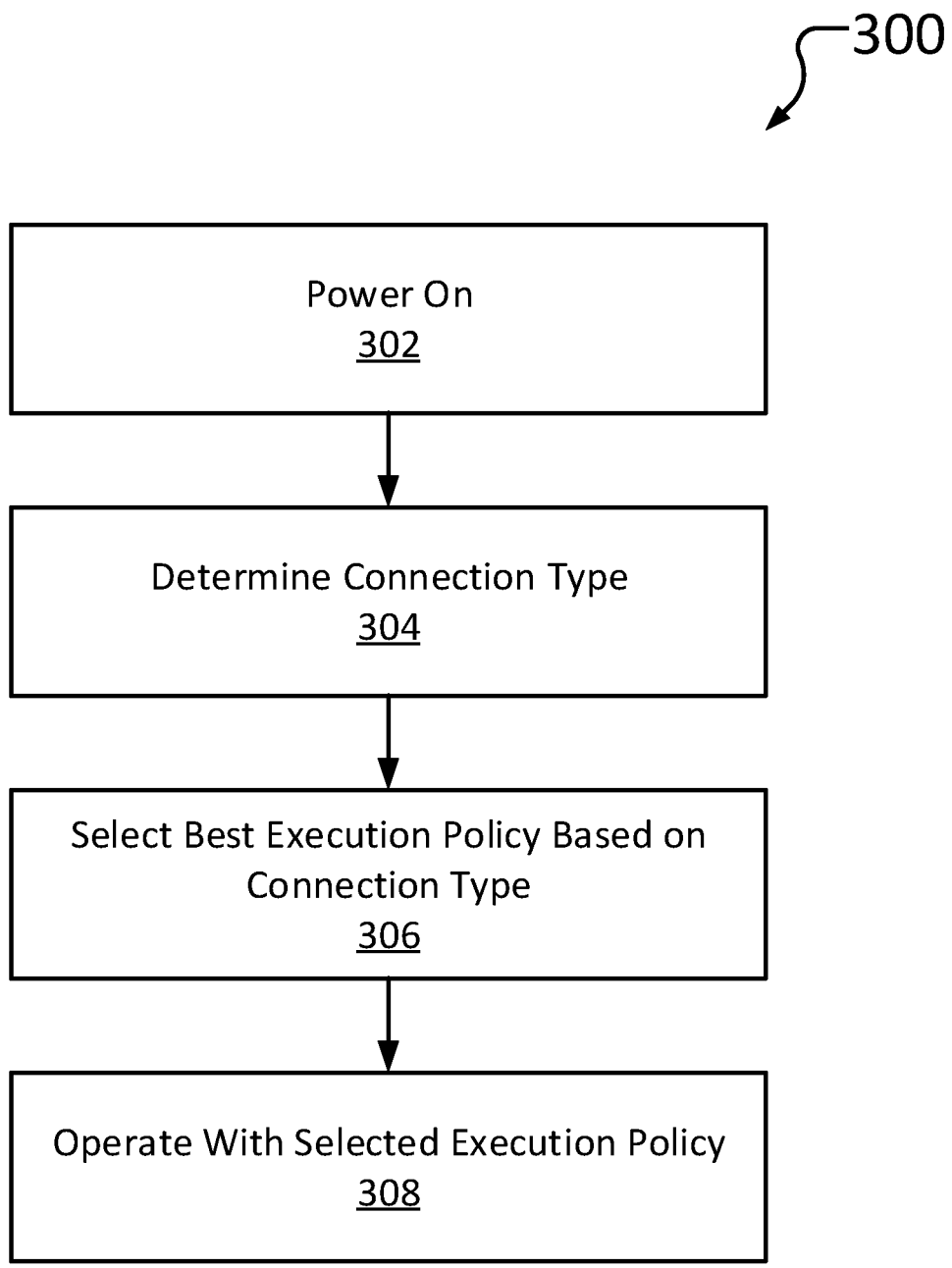
FIG. 3 illustrates operations according to one embodiment of the present disclosure.

FIG. 3 illustrates operations 300 according to one embodiment of the present disclosure. Operations according to this embodiment include receiving power at initial startup 302. Operations further include determining a connection type between a processor package (e.g., processor package 100) and an external circuit (e.g., a motherboard). This may include, for example, connection determination logic receiving a signal from a connection detection mechanism, the signal indicating a state of the connection detection mechanism, and determining a connection type based on the signal. Operations further include selecting a best execution policy based on the connection type 306. This may include, for example, execution policy selection logic receiving a signal indicating a connection type from connection determination logic, comparing the received connection type to a list of predetermined connection types with corresponding best execution policies, selecting an execution policy that corresponds to the connection type, and storing the selected policy in a register accessible to a processor. Operations also include operating with the selected execution policy 308. This may include, for example, a processor of a CPU die accessing a register with an executing policy stored thereon and executing instructions of a computer system in accordance with settings laid out by the execution policy.

Figure 4:
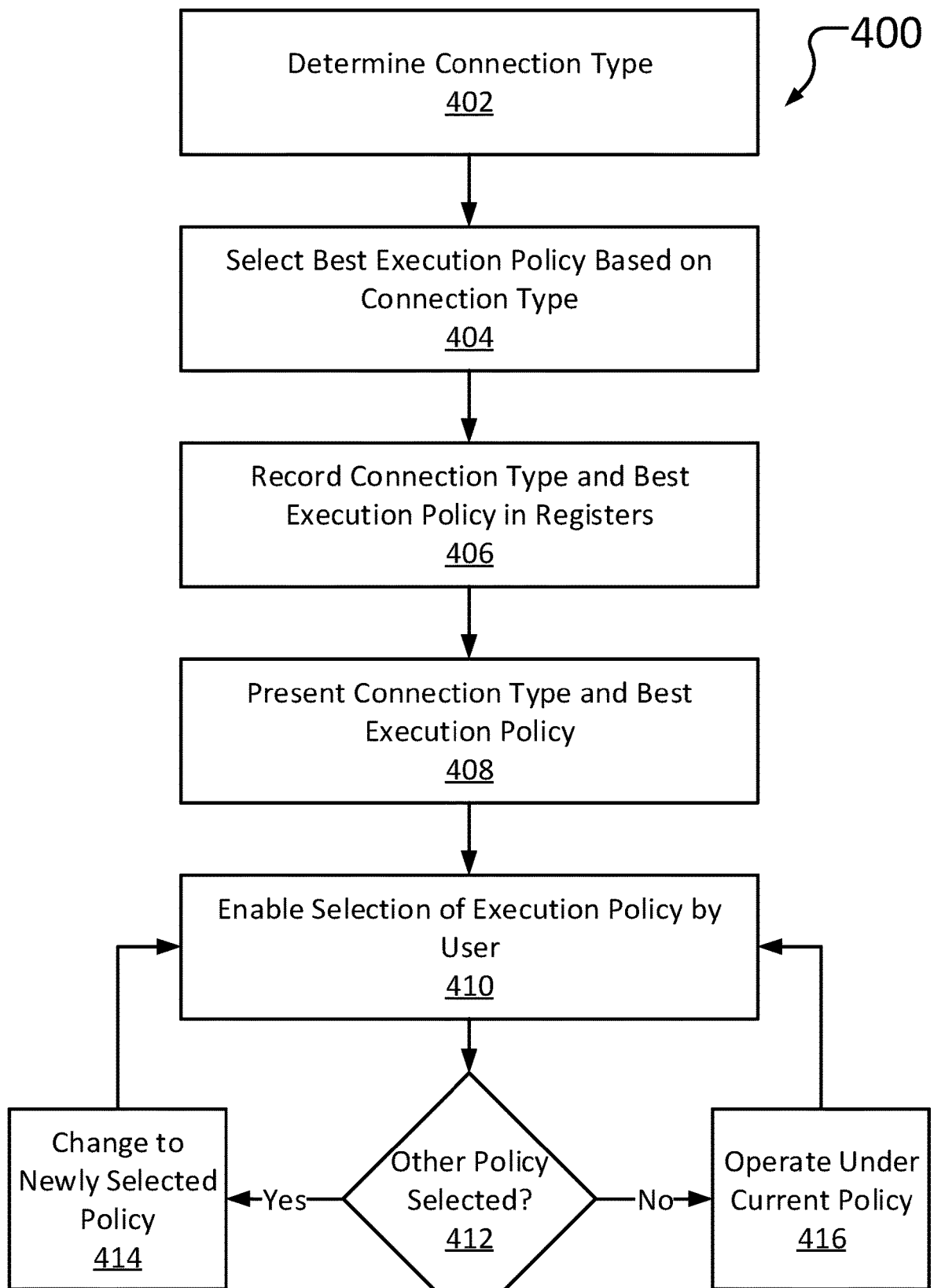
FIG. 4 illustrates operations according to one embodiment of the present disclosure.

FIG. 4 illustrates operations 400 according to one embodiment of the present disclosure. Operations according to this embodiment include determining a connection type 402 and selecting a best execution policy based on the connection type 404. These may include operations similar to, for example, 304 and 306 of FIG. 3. Operations 400 further include recording the connection type and best execution policy in one or more registers 406. Operations additionally include presenting the connection type and best execution policy 408. This may include, for example, an application executing in an application layer of a computer system architecture receiving the connection type and best execution policy from configuration and HW monitoring logic and presenting the connection type and best execution policy via a GUI (to, e.g., a user of the computer system).

Operations further include enabling selection of an execution policy by a user 410. This may include, for example, an application executing in an application layer enabling a GUI to receive one or more commands or instructions from a user to select a particular execution policy. Operations further include determining whether a policy other than the best execution policy has been selected 412. If a different policy has been selected (412 "Yes"), operations may further include operating under the selected different policy 414. This may include, for example, storing the selected policy in an execution policy register, causing a processor to execute operations according to the newly selected policy. Operations may then include continuing to monitor for selection of a different policy 410-412. If no policy has been selected or the currently executing policy has been selected (412 "No"), operations may include continuing to operate under the current policy 416, as well as continuing to await a different policy selection 410-412.

Figure 5A:
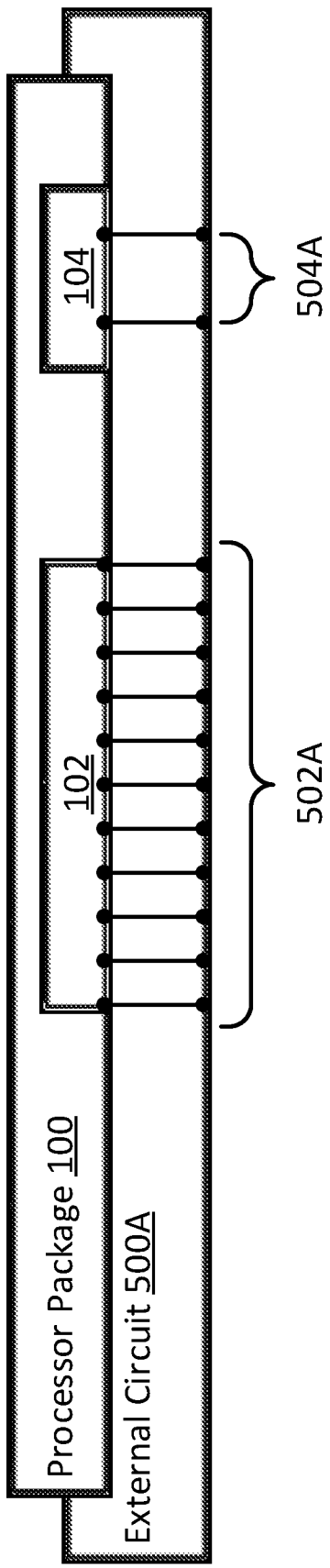
FIG. 5A illustrates an improved processor package integrating with an example external circuit according to multiple embodiments of the present disclosure.
Figure 5B:
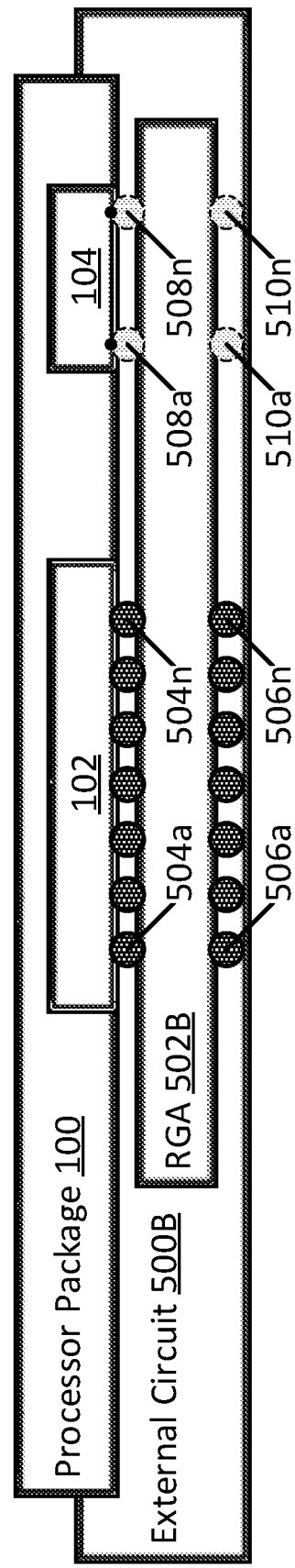
FIG. 5B illustrates an improved processor package integrating with an example external circuit according to multiple embodiments of the present disclosure.

FIG. 5A and FIG. 5B illustrate an improved processor package 100 integrating with example external circuits 500A and 500B, respectively, according to multiple embodiments of the present disclosure. With reference to FIG. 5A, external circuit 500A may comprise, for example, a motherboard with LGA socket including pins 502. When processor package 100 is connected to external circuit 500A, pins 502 are generally configured to make contact and electrically couple with connection interface 102. Circuit 500A also includes socket indicator pins 504A. As described with reference to FIG. 1, processor package includes connection detection mechanism 104. Connection detection mechanism 104 may be configured to make contact and electrically couple with socket type pins 504A. Thus, if pins 504A are receiving and conducting power, connection detection mechanism 104 will similarly be receiving and conducting power, indicating a powered state to logic 112 and enabling logic 112 to determine what kind of connection (e.g., LGA in a SKT vs. RGA) exists between package 100 and circuit 500A, as described above.

With reference to FIG. 5B, external circuit 500B may comprise, for example, a motherboard with example RGA interposer 502B. When processor package 100 is connected to external circuit 500B, solder balls 504a . . . 504n (collectively, "solder balls 504") and 506a-506n (collectively, "solder balls 506") couple external circuit 500B to RGA interposer 502B and couple RGA interposer 502B to processor package 100, respectively. While the type of connection in FIG. 5B is different from that of FIG. 5A (which may result in a substantially different performance envelope for processor package 100), connection interface 102 is nonetheless electrically coupled to circuit 500B.

Solder balls 508a-508n ("solder balls 508) and solder balls 510a-510n ("solder balls 510") are generally configured to couple external circuit 500B to connection detection mechanism 104 via RGA interposer 502B. In some embodiments, some or all of solder balls 508 and/or 510 may be omitted, resulting in connection detection mechanism 104 remaining partially or completely unconnected to external circuit 500B via RGA interposer 502B. In such embodiments, connection detection mechanism 104 may as a result be in one of various powered states, indicating a different connection type to logic 112. Solder balls 508 and 510 may be omitted, for example, by an original equipment manufacturer (OEM), added by an OEM but later removed by an end user, etc. In some embodiments, internal composition of RGA interposer 502B may control or otherwise affect power or connection states of mechanism 104, as will be described in further detail below in reference to FIG. 6.

Figure 6:
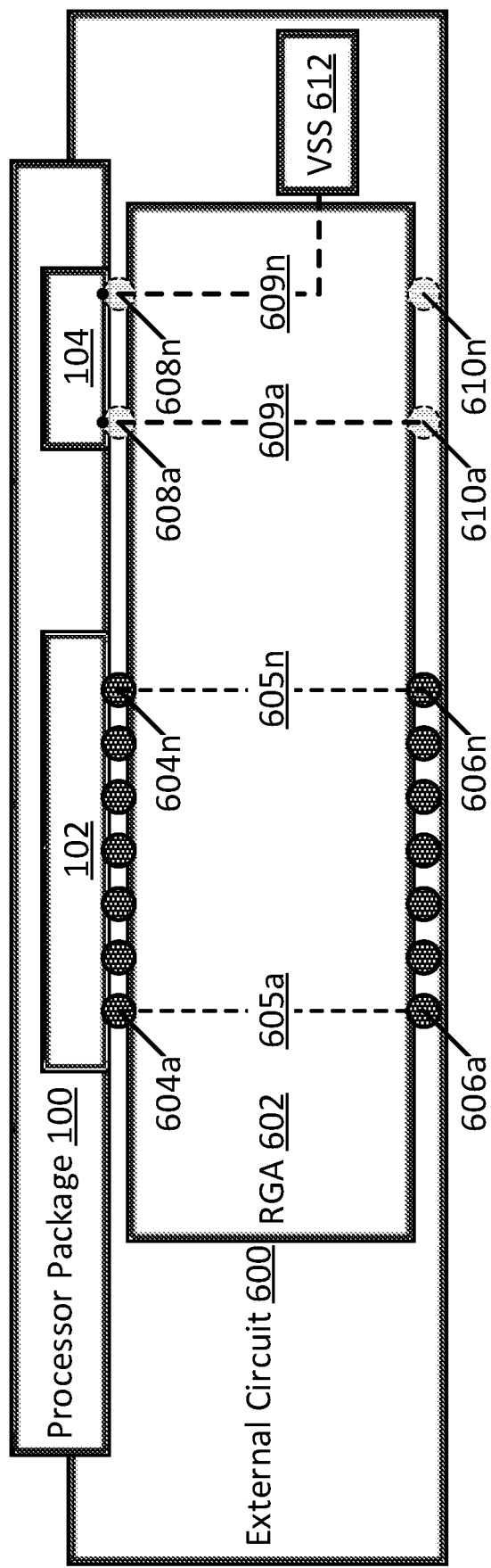
FIG. 6 illustrates an improved processor package integrating with an example external circuit according to at least one embodiment of the present disclosure.

FIG. 6 illustrates an improved processor package 100 integrating with an example external circuit 600 according to at least one embodiment of the present disclosure. External circuit 600 is depicted in additional detail, showing connections 605a-605n between solder balls 604a-604n and 606a-606n through RGA interposer 602. As with FIG. 5, in some embodiments, solder balls 608a-608n and 610a-610n may be omitted or may have been removed, etc. In some embodiments, even if solder balls 608 and 610 are installed, internal RGA connections 609 may "intercept," short, or otherwise reroute power away from connection detection mechanism 104. For example, as depicted in FIG. 6, while internal RGA connection 609a connects solder ball 610a to solder ball 608a, thus at least partially electrically coupling detection mechanism 104 to external circuit 600, internal RGA connection 609n may instead short 708n to negative power terminal VSS 612. Thus, the configuration depicted in FIG. 6 may result in logic 112 (not shown in FIG. 6) reading a "10" signal from mechanism 104. Similar embodiments can thus be envisioned wherein connection 609a is shorted instead of or in addition to 609n, resulting in logic 112 reading a "00" or "01" signal, respectively, or where neither connection is shorted, resulting in a "11." In some embodiments, more than 2 connections may be possible/monitored by logic 112, and thus similar internal changes to RGA interposer 602 may be possible to force or control additional possible states of mechanism 104.

Further, connections 609 may be shorted to circuitry other than VSS 612, including, for example, positive power VDD, ground, etc.; modifications to logic 112 may be made to ensure that states of detection mechanism 104 are interpreted correctly. Different signals may indicate, for example, different types of connection (SKT vs. RGA), different qualities of various types (e.g., varying qualities of RGA connection), different intended uses for the system (e.g., high performance vs. high stability), combinations thereof, etc.

Figure 7:
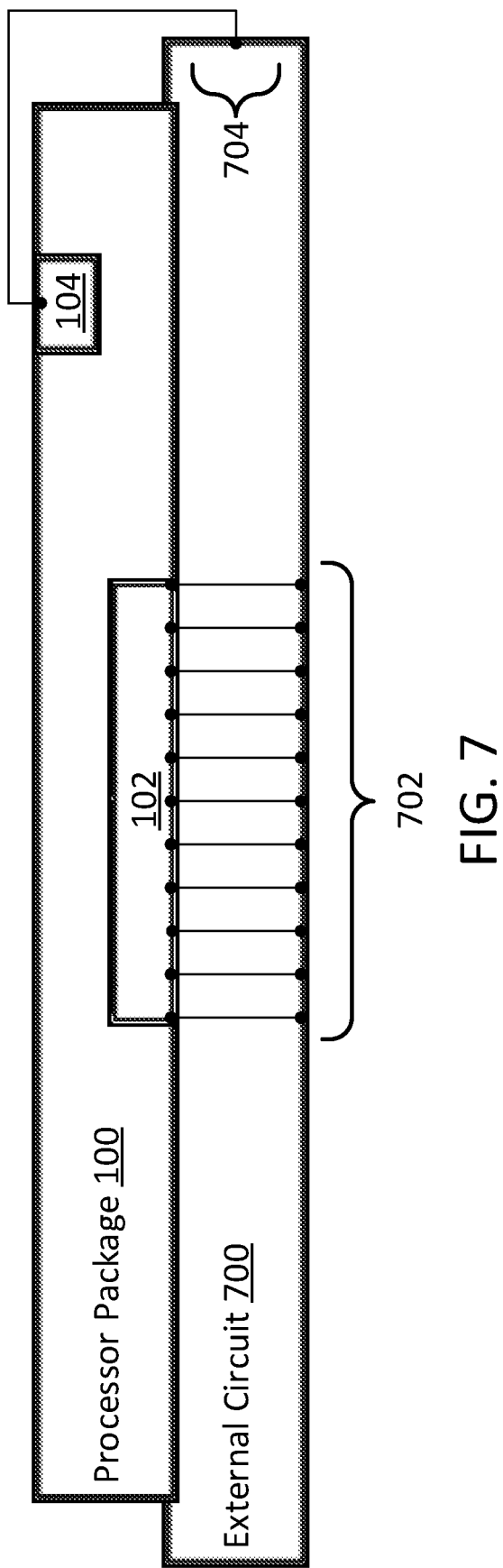
FIG. 7 illustrates an improved processor package integrating with an example external circuit according to at least one embodiment of the present disclosure.

FIG. 7 illustrates an improved processor package 100 integrating with an example external circuit 700 according to at least one embodiment of the present disclosure. Processor package 100 similarly includes connection interface 102 to connect and electrically couple with pins 702 of external circuit 700. However, in the embodiment depicted in FIG. 7, connection detection mechanism 104 is position on an opposite surface of processor package 100 and does not connect to any pins of external circuit 700. Instead, connection detection mechanism 104 may connect to a wire or cable 604 connecting to external circuit 700. In embodiments wherein an external circuit does not support such a connection 704, detection mechanism 104 will remain unpowered and thus indicate a different connection type to logic 112. In some embodiments, connection detection mechanism 104 may be configured to electrically couple to an intermediate component such as a bracket or subcomponent thereof, wherein an external circuit 700 of a first connection type will power the intermediate component, thus powering detection mechanism 104.

Figure 8:
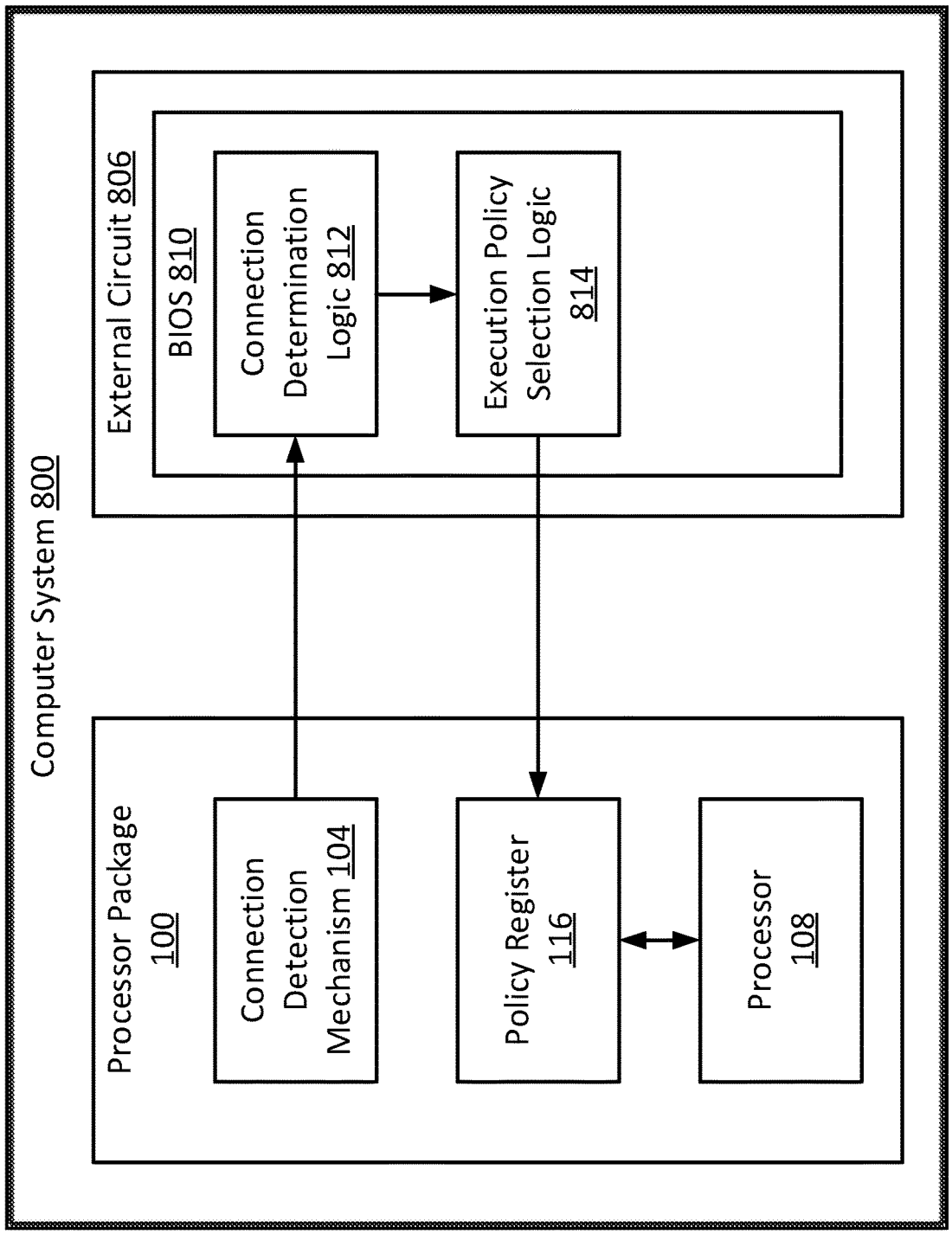
FIG. 8 illustrates an example computer system consistent with one embodiment of the present disclosure.

FIG. 8 illustrates an example computer system 800 consistent with one embodiment of the present disclosure. In the embodiment depicted in FIG. 8, processor package 100 includes connection detection mechanism 104 and policy register 802, while external circuit 806 includes BIOS 810. BIOS 810 includes connection determination logic 812, execution policy selection logic 814, and BIOS execution unit 808. Logic 812 and 814 are generally configured to perform operations similar to those of logic 112 and 114 of FIG. 1, respectively. For example, logic 812 is generally configured to determine a state of connection detection mechanism 104 and report this state to logic 114. Logic 114 is generally configured to receive state and/or connection type information from connection determination logic 812, determine an execution policy for processor 108, and store information corresponding to the policy in policy register 116. Processor 108 is generally configured to execute operations of computer system 800 in accordance with the execution policy stored in policy register 116. Depending upon configuration, computer system 800 may enable changes to be made to the execution policy, in which case processor 108 is configured to update policy register 116 accordingly.

Figure 9:
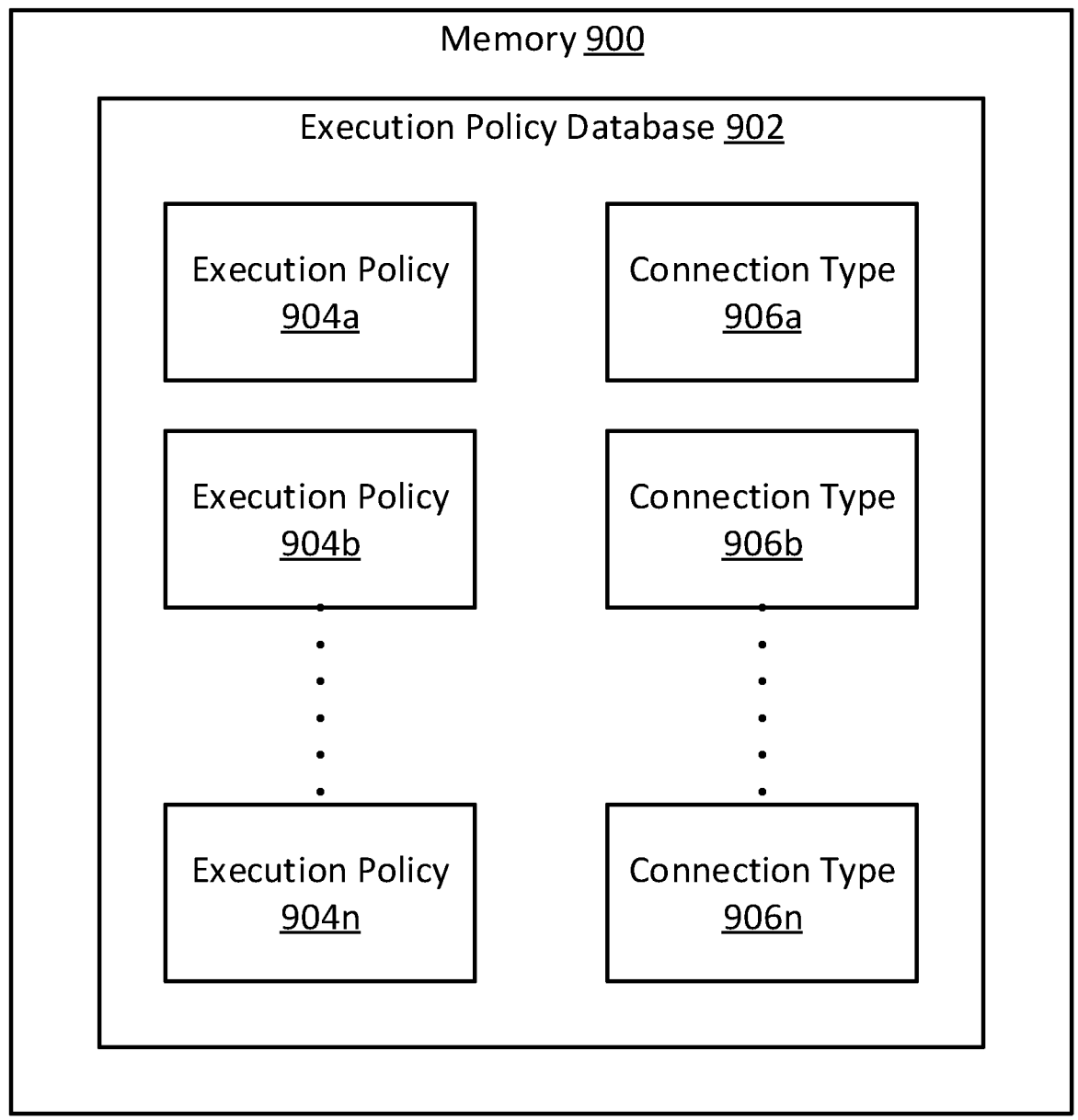
FIG. 9 illustrates an example execution policy database in accordance with several embodiments of the present disclosure.

FIG. 9 illustrates an example execution policy database 902 in accordance with several embodiments of the present disclosure. Memory 900 may include execution policy database 902. Database 902 is generally configured to include one or more execution policies 904a-904n (collectively, "policies 904"). Database 902 may also include one or more connection types 906a-906n (collectively, "connection types 906"), wherein policies 904 are generally associated with connection types 906. In some embodiments, some execution policies 904 may not be associated with any particular connection type, or vice versa. In some embodiments, multiple execution policies may be associated with one connection type. This may be beneficial, for example, if different execution policies correspond to different usage envelopes (e.g., high-performance vs. stability). In some embodiments, multiple connection types may be associated with a single execution policy. This may be useful if, for example, two or more connection types have similar enough performance characteristics that the same execution policy can be appropriately applied to both.

Policies 904 may be manually configured or set by a manufacturer of a computer system, may be automatically determined or generated (by, e.g., logic 114 (not shown in FIG. 9)), or may be entered by a user. In some embodiments, logic 114 is configured to access execution policy database 902 to determine which of policies 904 is appropriate given a particular connection type (e.g., as determined from logic 112, as described herein).

Various embodiments described herein refer to reflow grid array (RGA) connections. RGA connections generally enable improved connections between a processor package and a motherboard, enabling a processor of the processor package to increase performance while maintaining acceptable stability. RGA connections may be implemented with varying degrees of quality, depending upon limitations such as cost, manufacturing complexity, materials, performance targets, etc. Thus, it may be particularly beneficial for manufacturers of RGA-implementing motherboards to identify which of several kinds of RGA connections is included. As a non-limiting example, RGA connections may be sorted into three tiers (e.g., "good," "better," and "best") various characteristics of the connection in comparison with associated thresholds. Using systems and methods described herein, this may enable processor packages to quickly and/or automatically determine a type of connection and operate under a corresponding appropriate execution policy.

In some embodiments, the systems and methods described herein may enable a processor package and/or external circuit (e.g., motherboard) to determine characteristics of a connection type between the package and external circuit without preset identifiers. For example, manufacturers may enable computer systems to dynamically determine and/or generate appropriate execution policies for connection types without specifically identifying the connection type itself. For example, connection detection mechanism 104 may be configured to be in one of a plurality of states, wherein each state corresponds to a given set of ranges of connection type characteristics. As a non-limiting example, mechanism 104 may have 32 possible states, enabling logic 112 to determine at least 32 bits of information about the connection type. Additional states are also possible (e.g., 33, 64, etc.) depending upon hardware configurations. For example, additional states may require additional possible connections for mechanism 104, and processor package connections are often space-limited. However, some embodiments (such as that depicted in FIG. 7) alleviate this issue by utilizing space on parts of the package that are comparatively in less demand (e.g., the sides, the back/surface, etc.).

Operations for the embodiments have been described with reference to the above figures and accompanying examples. Some of the figures may include a logic flow. Although such figures presented herein may include a particular logic flow, it can be appreciated that the logic flow merely provides an example of how the general functionality described herein can be implemented. Further, the given logic flow does not necessarily have to be executed in the order presented unless otherwise indicated. In addition, the given logic flow may be implemented by a hardware element, a software element executed by a processor, or any combination thereof. The embodiments are not limited to this context.

The operations described herein may be implemented in a system that includes one or more storage mediums having stored thereon, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), Flash memories, Solid State Disks (SSDs), embedded multimedia cards (eMMCs), secure digital input/output (SDIO) cards, magnetic or optical cards, or any type of media suitable for storing electronic instructions. Other embodiments may be implemented as software modules executed by a programmable control device.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. Thus, the breadth and scope of the present invention should not be limited by any of the above-described exemplary embodiments, but should be defined only in accordance with the following claims and their equivalents.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in any embodiment herein, the term "logic" may refer to software, firmware and/or circuitry configured to perform any of the aforementioned operations. Software may be embodied as a software package, code, instructions, instruction sets and/or data recorded on non-transitory computer readable storage mediums. Firmware may be embodied as code, instructions or instruction sets and/or data that are hard-coded (e.g., nonvolatile) in memory devices. "Circuitry", as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry. The logic may, collectively or individually, be embodied as circuitry that forms part of a larger system, for example, an integrated circuit (IC), system on-chip (SoC), desktop computers, laptop computers, tablet computers, servers, smartphones, etc.

The following examples pertain to further embodiments. The following examples of the present disclosure may comprise subject material such as an apparatus, a method, at least one machine-readable medium for storing instructions that when executed cause a machine to perform acts based on the method, means for performing acts based on the method and/or a system for anatomical feature orientation determination.

According to example 1, there is provided an improved processor package. The processor package may comprise a connection interface to connect the processor package to an external circuit, the connection interface including a connection detection mechanism, and at least one central processing unit (CPU) die, the at least one CPU die including at least connection determination logic to determine a connection type based, at least in part, on a state of the connection detection mechanism, execution policy logic to determine an execution policy based at least on the connection type, and at least one processor to execute instructions based on the execution policy.

Example 2 may include the elements of example 1, further comprising a policy register, wherein the execution policy logic is to store the execution policy in the policy register.

Example 3 may include the elements of any of examples 1-2, further comprising an execution policy database including a plurality of stored execution policies, wherein the execution policy logic is to determine the execution policy by selecting from the plurality of stored execution policies.

Example 4 may include the elements of any of examples 1-2, wherein the execution policy logic is to generate the execution policy based at least on the connection type.

Example 5 may include the elements of any of examples 1-4, wherein the connection interface comprises a plurality of conductive surfaces to conductively connect to one or more connection components, and the connection detection mechanism comprises one or more of the plurality of conductive surfaces.

Example 6 may include the elements of any of examples 1-5, wherein the state of the connection detection mechanism is based on one or more electrical connection states of the one or more conductive surfaces of the connection detection mechanism.

Example 7 may include the elements of any of examples 1-6, wherein the execution policy corresponds to a high-performance setting.

Example 8 may include the elements of any of examples 1-6, wherein the execution policy corresponds to a high stability setting.

According to example 9 there is provided a computer system architecture. The computer system architecture may comprise a processor package, the processor package including a processor connection interface, the processor connection interface having a connection detection mechanism, and one or more processors to execute instructions based on the execution policy, and a motherboard operably coupled to the processor package, the motherboard including a motherboard connection interface to connect the motherboard to the processor package via the processor package interface, the motherboard connection interface having a connection type, connection determination logic to determine the connection type based, at least in part, on a state of the connection detection mechanism, and execution policy logic to determine an execution policy based at least on the connection type.

Example 10 may include the elements of example 9, further comprising a policy register, wherein the policy selection logic is to store the execution policy in the policy register.

Example 11 may include the elements of any of examples 9-10, wherein the connection type includes at least one of a Land Grid Array (LGA)-type connection, and a Reflow Grid Array (RGA)-type connection.

Example 12 may include the elements of any of examples 9-11, wherein the motherboard connection interface includes a plurality of connection components to conductively connect to the processor connection interface, and the processor connection interface includes a plurality of conductive surfaces to conductively connect to the plurality of connection components.

Example 13 may include the elements of any of examples 9-12, further comprising an RGA interposer, and wherein the plurality of connection components includes a first plurality of solder balls to electrically couple the motherboard to the RGA interposer, and a second plurality of solder balls to electrically couple the RGA interposer to the processor package.

Example 14 may include the elements of example 13, wherein the RGA interposer includes a plurality of internal connections to electrically couple the first plurality of solder balls to the second plurality of solder balls.

Example 15 may include the elements of any of examples 13-14, further comprising a first plurality of connection type solder balls to electrically couple the motherboard to the connection determination mechanism via the RGA interposer.

Example 16 may include the elements of example 15, wherein the plurality of internal connections includes one or more connection type lines, and at least one of the connection type lines is to electrically short at least one of the connection type solder balls to a power pin.

Example 17 may include the elements of any of examples 9-16, further comprising a processor code (p-code) layer, wherein the connection determination logic is to operate within the p-code layer.

Example 18 may include the elements of any of examples 9-17, further comprising memory circuitry, and a basic input/output system (BIOS) to operate within a BIOS layer, the BIOS to store system configuration information corresponding to the computer system architecture in the memory circuitry.

Example 19 may include the elements of any of examples 9-18, further comprising a firmware layer, the firmware layer including one or more hardware monitors to monitor performance characteristics of at least the processor package.

Example 20 may include the elements of any of examples 18-19, further comprising an operating system (OS) layer, the OS layer including configuration logic to receive the system configuration information stored in the memory.

Example 21 may include the elements of any of examples 18-20, further comprising an application layer, the application layer including configuration history logic to monitor changes in the system configuration information, performance history logic to monitor changes in the performance characteristics, and performance analytics logic to determine system performance correlations based at least on changes in the system configuration information and changes in the performance characteristics.

Example 22 may include the elements of example 21, wherein the performance history logic is further to receive optimization information from a cloud service, and the performance analytics logic is further to receive the optimization information from the performance history logic; and cloud service, and determine the system performance correlations based further on the optimization logic.

Example 23 may include the elements of any of examples 21-22, wherein the application layer further includes a graphical user interface (GUI) to receive the correlated changes from the performance analytics logic, and present at least the correlated changes and the execution policy.

Example 24 may include the elements of example 23, wherein the GUI is further to enable a user to select an execution policy, and the performance analytics logic is further to determine whether a new execution policy has been selected, and responsive to a determination that a new execution policy has been selected, cause the processor to execute the operations under the new execution policy.

According to example 25 there is provided a method for improving performance of a processor package. The method may comprise connecting, via a connection interface, a processor package to an external circuit, the connection interface including a connection detection mechanism, determining, via connection determination logic, a state of the connection detection mechanism, determining, via the connection determination logic, a connection type based, at least in part, on the state of the connection detection mechanism, determining, via execution policy logic, an execution policy based at least on the connection type, and executing, via a processor, instructions based on the execution policy.

Example 26 may include the elements of example 25, further comprising storing, via the execution policy logic, the execution policy in a policy register.

Example 27 may include the elements of any of examples 25-26, wherein the determining, via the execution policy logic, an execution policy based at least on the connection type includes selecting, via the execution policy logic, the execution policy from a plurality of stored execution policies, the plurality of stored execution policies stored in an execution policy database.

Example 28 may include the elements of any of examples 25-26, further comprising generating, via the execution policy logic, the execution policy based at least on the connection type.

Example 29 may include the elements of any of examples 25-28, wherein the state of the connection detection mechanism is based on one or more electrical connection states of the one or more conductive surfaces of the connection detection mechanism.

Example 30 may include the elements of any of examples 25-29, wherein the execution policy corresponds to a high-performance setting.

Example 31 may include the elements of any of examples 25-30, wherein the execution policy corresponds to a high stability setting.

Example 32 may include the elements of any of examples 25-31, wherein the connection type includes at least one of a Land Grid Array (LGA)-type connection, and a Reflow Grid Array (RGA)-type connection.

According to example 33 there is provided a system including at least one device, the system being arranged to perform the method of any of the above examples 25 to 32.

According to example 34 there is provided a chipset arranged to perform the method of any of the above examples 25 to 32.

According to example 35 there is provided at least one machine readable storage device have a plurality of instructions stored thereon which, when executed on a computing device, cause the computing device to carry out the method according to any of the above examples 25 to 32.

According to example 36 there is provided a system for improving performance of a processor package. The system may comprise means for connecting a processor package to an external circuit, means for determining a state of a connection detection mechanism, means for determining a connection type based, at least in part, on the state of the connection detection mechanism, means for determining an execution policy based at least on the connection type, and means for executing instructions based on the execution policy.

Example 37 may include the elements of example 36, further comprising means for storing the execution policy in a policy register.

Example 38 may include the elements of any of examples 36-37, further comprising means for storing a plurality of stored execution policies, and wherein the means for determining an execution policy based at least on the connection type comprises means for selecting the execution policy from the plurality of stored execution policies.

Example 39 may include the elements of any of examples 36-37, further comprising means for generating the execution policy based at least on the connection type.

Example 40 may include the elements of any of examples 36-39, wherein the state of the connection detection mechanism is based on one or more electrical connection states of the one or more conductive surfaces of the connection detection mechanism.

Example 41 may include the elements of any of examples 36-40, wherein the execution policy corresponds to a high-performance setting.

Example 42 may include the elements of any of examples 36-41, wherein the execution policy corresponds to a high stability setting.

Example 43 may include the elements of any of examples 36-42, wherein the connection type includes at least one of a Land Grid Array (LGA)-type connection, and a Reflow Grid Array (RGA)-type connection.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. A semiconductor package, comprising:
   a connection interface to couple a semiconductor die that includes central processing unit (CPU) circuitry to a semiconductor package substrate
   at least one connection detection mechanism;
   connection determination circuitry to determine a connection type between the semiconductor die and the semiconductor package substrate based, at least in part, on a state of the at least one connection detection mechanism; and
   execution policy circuitry to determine an execution policy for the semiconductor die based at least on the determined connection type between the semiconductor die and the semiconductor package substrate, the execution policy generated based on a performance history associated with different connection types.

2. The semiconductor package of claim 1, further including a policy register, wherein the execution policy circuitry is to cause a storage of the execution policy in the policy register.

3. The semiconductor package of claim 1, further including an execution policy database including a plurality of stored execution policies, wherein the execution policy circuitry is to determine the execution policy by selecting from the plurality of stored execution policies.

4. The semiconductor package of claim 1, wherein:
   the connection interface comprises a plurality of conductive surfaces to conductively connect to one or more connection components; and
   the connection detection mechanism comprises one or more of the plurality of conductive surfaces.

5. The semiconductor package of claim 1, wherein the state of the connection detection mechanism is based on one or more electrical connection states of the one or more conductive surfaces of the at least one connection detection mechanism.

6. The semiconductor package of claim 1, wherein the execution policy corresponds to a high-performance setting.

7. The semiconductor package of claim 1, wherein the execution policy corresponds to a high stability setting.

8. A computer system architecture,
comprising: a processor package, the processor package including:
at least one semiconductor die that includes central processing unit (CPU) circuitry;
a processor connection interface, the processor connection interface having a processor package connection detection mechanism; and
a motherboard operably coupled to the processor package, the motherboard including:
a motherboard connection interface to couple the motherboard to the processor package via the processor package interface, the motherboard connection interface having a connection type;
wherein the processor package connection detection mechanism determines the connection type between the processor package and the motherboard;
wherein the CPU circuitry includes connection determination circuitry to determine the connection type between the motherboard and the processor package based, at least in part, on a state of the processor package connection detection mechanism; and
execution policy circuitry to determine an execution policy for the semiconductor die based at least on the connection type, the execution policy generated based on a performance history associated with the CPU circuitry, the performance history including performance history associated with different connection types.

9. The computer system architecture of claim 8, further including policy selection circuitry associated with a policy register, wherein the policy selection circuitry is to cause a storage of the execution policy in the policy register.

10. The computer system architecture of claim 8, wherein the connection type between the processor package and the motherboard includes at least one of:
a Land Grid Array (LGA)-type connection; and
a Reflow Grid Array (RGA)-type connection.

11. The computer system architecture of claim 8, wherein:
the motherboard connection interface includes a plurality of connection components to conductively connect to the processor connection interface; and
the processor connection interface includes a plurality of conductive surfaces to conductively couple to the plurality of connection components.

12. The computer system architecture of claim 11, further including an interposer; and
wherein the plurality of connection components includes:
a first plurality of solder balls to electrically couple the motherboard to the ROA interposer; and
a second plurality of solder balls to electrically couple the ROA interposer to the processor package.

13. The computer system architecture of claim 12, wherein the interposer includes a plurality of internal connections to electrically couple the first plurality of solder balls to the second plurality of solder balls.

14. The computer system architecture of claim 13, further including a first plurality of connection type solder balls to electrically couple the motherboard to the connection determination mechanism via the ROA interposer.

15. The computer system architecture of claim 14, wherein:
the plurality of internal connections includes one or more connection type lines; and
at least one of the connection type lines is to electrically short at least one of the connection type solder balls to a power pin.

16. The computer system architecture of claim 8, further including a processor code (p-code) layer, wherein the p-code layer includes at least a portion of the connection determination circuitry.

17. The computer system architecture of claim 8, further including:
memory circuitry; and
a basic input/output system (BIOS) to operate within a BIOS layer, the BIOS to store system configuration information corresponding to the computer system architecture in the memory circuitry.

18. The computer system architecture of claim 17, further including a firmware layer, the firmware layer including one or more hardware monitors to monitor performance characteristics of at least the processor package.

19. The computer system architecture of claim 18, further including an operating system (OS) layer, the OS layer including configuration logic to receive the system configuration information stored in the memory.

20. The computer system architecture of claim 19, further including an application layer, the application layer including:
configuration history circuitry to monitor changes in the system configuration information;
performance history circuitry to monitor changes in the performance characteristics; and
performance analytics circuitry to determine system performance correlations based at least on changes in the system configuration information and changes in the performance characteristics.

21. The computer system architecture of claim 20, wherein: the performance history circuitry is further to receive optimization information from a cloud service; and
the performance analytics circuitry is further to:
receive the optimization information from the performance history circuitry and cloud service; and
determine the system performance correlations based further on optimization logic.

22. The computer system architecture of claim 20, wherein the application layer further includes a graphical user interface (GUI) to:
receive the correlated changes from the performance analytics circuitry; and
present at least the correlated changes and the execution policy.

23. The computer system architecture of claim 22,
wherein: the GUI is further to enable a user to select an execution policy; and
the performance analytics circuitry is further to:
determine whether a new execution policy has been selected; and
responsive to a determination that a new execution policy has been selected, cause the CPU circuitry to execute the operations under the new execution policy.

24. A method, comprising:
coupling, via a connection interface, a semiconductor die that includes central processing unit (CPU) circuitry to a semiconductor package substrate, the connection interface including at least one connection detection mechanism;

determining, via connection determination circuitry included in the CPU circuitry, a state of the at least one connection detection mechanism;

determining, via the connection determination circuitry, a connection type between the semiconductor die based, at least in part, on the state of the at least one connection detection mechanism; and determining, via execution policy circuitry, an execution policy for the semiconductor die based at least on the determined connection type between the semiconductor die and the semiconductor package substrate, the execution policy generated based on a performance history associated with different connection types.

25. The semiconductor package of claim 1, wherein the execution policy corresponds to a performance history of a CPU of the CPU circuitry with the different connection types.

26. The semiconductor package of claim 25, wherein the execution policy corresponds to performance analytics of at least one of the CPU or the CPU circuitry.

27. The semiconductor package of claim 25, wherein the performance analytics correspond to changes in system configuration information associated with the different connection types.

28. The semiconductor package of claim 1, wherein the execution policy is obtained from a cloud service.

29. The semiconductor package of claim 1, wherein the performance history corresponds to a tracked performance history of the CPU circuitry.

* * * * *